United States Patent [19]
Miller et al.

[11] Patent Number: 5,340,680
[45] Date of Patent: Aug. 23, 1994

[54] DESENSITIZABLE RECORD MATERIAL

[75] Inventors: Robert E. Miller; Lowell Schleicher; Robert W. Brown; Lucy Feldman, all of Appleton, Wis.

[73] Assignee: Appleton Papers Inc., Appleton, Wis.

[21] Appl. No.: 943,090

[22] Filed: Sep. 10, 1992

[51] Int. Cl.$^5$ ................................. G03C 1/73
[52] U.S. Cl. ................................. 430/138; 430/338; 430/964; 503/215
[58] Field of Search ............... 430/138, 964, 338; 503/215

[56] References Cited

U.S. PATENT DOCUMENTS

| | | | |
|---|---|---|---|
| 3,219,446 | 11/1965 | Berman et al. | 96/28 |
| 4,343,885 | 8/1982 | Reardon, Jr. | 430/177 |
| 4,454,083 | 6/1984 | Brown et al. | 264/4.7 |
| 4,529,681 | 7/1985 | Usami et al. | 430/138 |
| 4,552,811 | 11/1985 | Brown et al. | 428/402.21 |
| 4,682,194 | 7/1987 | Usami et al. | 503/215 |
| 4,912,011 | 3/1990 | Yamamotoa et al. | 430/138 |
| 4,936,916 | 6/1990 | Shinmitsu et al. | 106/21 |
| 4,963,458 | 10/1990 | Ishikawa et al. | 403/138 |
| 4,999,333 | 3/1991 | Usami et al. | 503/209 |
| 5,134,052 | 7/1992 | Hipps, Sr. et al. | 430/138 |
| 5,283,015 | 2/1994 | Hutchings et al. | 264/4.7 |

FOREIGN PATENT DOCUMENTS 3-261588 11/1991 Japan .

OTHER PUBLICATIONS

Abstract of JP 56–016571, "Microcapsule Composition", Fuchigami et al. (Feb. 1981).

Primary Examiner—Charles L. Bowers, Jr.
Assistant Examiner—John A. McPherson
Attorney, Agent, or Firm—Benjamin Mieliulis

[57] ABSTRACT

A novel record material is disclosed comprising a substrate bearing microcapsules having nonmeltable walls. The microcapsules contain a chromogen or developer and a photosensitive composition internal thereof, said microcapsules undergoing a change in viscosity upon exposure to actinic radiation. The walls of the microcapsules have an elongation of not more than 1%, and the record material is resistant to heat, measured by not producing any substantial color when placed in a 150° C. oven for one minute. Surprisingly, the record material however is capable of forming a color upon application to the record material of a point source energy input comprising a $\Delta T$ of at least 115° C. per one millisecond.

10 Claims, No Drawings

DESENSITIZABLE RECORD MATERIAL

BACKGROUND OF THE INVENTION

1. Field of Invention

This invention relates to record material. It more particularly relates to such record material in the form of sheets or rolls coated with color-forming systems comprising chromogenic material (electron-donating dye precursors) and acidic color developer material. This invention particularly concerns record material capable of forming non-reversible images and capable of being desensitized.

2. Description of Related Art

Thermally-responsive record material systems are well known in the art and are described in many patents, for example, U.S. Pat. Nos. 3,539,375; 3,674,535; 3,746,675; 4,151,748; 4,181,771; 4,246,318; and 4,470,057 which are incorporated herein by reference. In these systems, basic chromogenic material and acidic color developer material are contained in a coating on a substrate which, when heated to a suitable temperature, melts or softens to permit said materials to react, thereby producing a colored mark.

Thermally-responsive record materials have characteristic thermal responses, desirably producing a colored image of sufficient intensity upon selective thermal exposure. Improvements in thermal response would be of commercial significance.

A drawback of conventional thermally-responsive record materials or facsimile paper limiting utilization in certain environments and applications has been the undesirable tendency of thermally-responsive record materials upon forming an image to not retain that image in its original integrity over time when the thermally-responsive record material is subsequently handled. The thermally-sensitive coating of a thermally-responsive record material continues to be active after imaging. For example, facsimile papers, even after imaging, if scratched by a blunt instrument or if exposed to temperatures above about 50° C.-55° C. will blacken, respectively. As a result, due care and control in handling imaged thermally-responsive record materials has been required.

U.S. Pat. No. 4,529,681 discloses a light- and heat-sensitive record material relying on use of permeable capsules relying on heat to effect coloring component permeation through the thermoplastic capsule wall.

The ability of a thermally-responsive record material to be able to be resistant to ambient heating appears contradictory. However, it is an object of the present invention to disclose a novel record material bearing non-meltable capsules resistant to ambient heat but said capsules capable of rupture in a thermal printer and said record material capable of being deactivated after imaging.

DETAILED DESCRIPTION

The present invention is a novel record material comprising a substrate bearing microcapsules having walls selected from non-meltable or thermoset resins. The microcapsules contain a chromogen and a photosensitive composition. The microcapsules are made of a resin with thermosetting properties, are non-meltable and the contents thereof undergo a change in viscosity upon exposure to actinic radiation. An acidic developer material is outside of said microcapsules and capable of reacting with the chromogen to produce a color. Reverse configurations with the chromogen positioned outside the capsules are also possible. The walls of the microcapsules have an elongation of not more than 1%. As such they can be described as brittle. The record material is resistant to heat, defined as not producing any substantial color when placed in a 150° C. oven for one minute. However, and almost contradictorily, the record material is capable of forming a color upon application to the record material of a point source energy input comprising a $\Delta T$ of at least 115° C. per one millisecond. A conventional thermal print head found in common facsimile machines is defined as such a point source energy input device for purposes herein.

The present invention is a novel record material comprising a substrate bearing microcapsules having walls of thermosetting resin with critically an elongation of not more than 1%. The thermosetting resin is preferably selected from methylated methylol melamine, or selected from combinations of urea and formaldehyde, melamine and formaldehyde, or methylol melamine polymerized at a temperature of at least 65° C., or selected from dimethylol urea, or methylated dimethylol urea wherein the molar ratio of formaldehyde to urea is from 1.9 to 2.1 and preferably the molar ratio of formaldehyde to urea is 2:1. The reactants can be substituted such as with alkylated groups. Table 1 lists elongations of a variety of resins. A portion of the urea can be replaced by a hydroxy-substituted phenol, such as resorcinol. The microcapsule walls are nonmeltable.

A photosensitive composition is provided inside the microcapsules along with a color former. The photosensitive composition undergoes a change in viscosity preferably by hardening upon exposure to actinic radiation. An acidic developer material is provided outside the microcapsules interspersed therewith or provided as an overcoat layer or subbing layer. Exposure of the record material to a point source energy input comprising a $\Delta T$ ("change in temperature") of at least 1150° C. per one millisecond is sufficient to rupture the capsules and this is theorized to occur due to induced or produced stresses.

Though the record material characteristics are described in terms of a point source energy input such as a thermal print head, it is readily apparent and understood that such record material can be imaged with a larger input device such as a rapidly heating block or multiplicity of thermal print heads assembled as a larger unit. Point sources can take the form of a thermal print head, laser, focused hot jets, heated stylus and the like. The ability to effect a change in temperature of at least 115° C. per one millisecond at the record system surface is needed to effect the unusual shattering of the non-meltable capsules of the invention. Shattering is believed attributable to induced or produced thermal stresses though the invention disclosed herein should not be construed as limited to this one underlying theory, as other mechanisms may also be operating.

The elongation value for the wall material of the microcapsules can be taken from tables for various resins. The published values correlated well with the observed phenomena and provide a convenient means to select appropriate resins. Resins having elongation values of not more than 1% selected to be used as wall material result in microcapsules with nonmeltable polymeric shells or wall material displaying the unusual characteristics of shattering attributable to induced thermal stresses.

Table 1 summarizes elongation values for a variety of resin materials.

TABLE 1

| Resin | Elongation (%) |
|---|---|
| acetal | 60–75 |
| acrylic | 20–50 |
| cellulose | 5–100 |
| fluorcarb | 80–400 |
| ionomers | 100–600 |
| polyamides | 25–300 |
| polycarbonates | 60–100 |
| polyethylenes | 5–900 |
| polypropylenes | 3–700 |
| polystyrenes | 1–140 |
| vinyls | 2–400 |
| epoxies | 1–70 |
| phenolics | 1–2 |
| phenol formaldehyde | 0.4–2 |
| melamine formaldehyde | 0.6–1.0 |
| polyester | 40–300 |
| polyester alkyd | 0.5–2 |
| silicone | 100 |
| urea formaldehyde | 0.5 |
| urethane | 300–1000 |
| nylon | 300 |

The elongation of the polymeric shells or wall is determined for purposes of the invention, from the elongation (%) value of the bulk resins when polymerized and using standards tests such as ASTM test method D638.

More conveniently, tables of elongation (%) values for a variety of resins are available from a variety of sources including pages 532 to 537 of *Principles of Polymer Systems*, 2nd Edition by Ferdinand Rodriguez of Cornell University, published by Hemisphere Publishing Corporation (1970). The elongation values for the bulk material correlated well as a surprising predictor of resins functional in the invention.

The capsules of the record material, unlike the prior art, do not melt upon energy input, but rather appear to fracture from rapid change in temperature or energy input. Significantly this gives rise to a novel material which is heat resistant. Surprisingly the record material of the invention can be placed in a hot oven (150° C.) for substantial time periods such as one minute and not image or develop substantial coloration. Conventional thermal paper by contrast images in an oven almost instantaneously. The record material of the invention has exhibited charting of the substrate without image formation or coloration. An acidic developer material is provided outside the microcapsules interspersed therewith or provided as an overcoat layer or subbing layer. Exposure of the record material to point source energy input, such as with a conventional facsimile machine thermal print head, however, produces a color reaction between the color former in the microcapsules and the acidic developer. The insulating characteristics of the wall material and the absence of heat dissipation via phase change appears to lead to a high concentration of energy at the contact area between the point source and the capsule.

Instead of melting, becoming plasticized with other melted materials, or increasing in permeability due to a phase transformation, this wall appears to rupture. Failure of the capsule wall appears attributed to a high temperature gradient and nonsteady state of heat transfer. Such conditions create localized thermal stresses. The magnitude of the stress depends on the properties of the material. A brittle wall can sustain less strain and thus ruptures.

Elongation properties appear to correlate well with wall brittleness and facilitate selection of resin.

The facsimile paper according to the invention has discretely imageable capsules with little or no bleed outside the capsule area. More importantly, following imaging such as with a thermal print head of a conventional facsimile machine, the resultant imaged facsimile sheet can be deactivated. Deactivation of the active thermally-sensitive coating of the facsimile sheet is readily accomplished by exposure of the sheet to actinic radiation.

The capsules of the invention surprisingly fracture upon application of a point source energy input comprising a change in temperature ($\Delta T$) of at least 115° C. per one millisecond.

$\Delta T$ can be calculated according to the formula $$S = E\alpha(T - To)$$

S refers to stress
E is modulus of elasticity
$\alpha$ is coefficient of linear thermal expansion
$\Delta T$ is $T - To$ in the above formula. S which is stress ranges for melamine formaldehyde polymers from $5 \times 10^{-3}$ psi to $13 \times 10^{-3}$ psi and for phenol formaldehyde polymer ranges from about $5 \times 10^{-3}$ psi to about $9 \times 10^{-3}$ psi. To calculate the lower practical point source energy input S is taken as 5 (psi$\times 10^{-3}$). The modulus of elasticity ranges from about 11 to 14 (psi$\times 10^{-5}$). On the lower range thus, E is taken as 11. The coefficient of linear thermal expansion is 4 ($k^{-1} \times 105^5$).

Therefore, $5000 = (11 \times 10^{-5})(4)(10^5)T - To$ $T - To = \Delta T = 113.6°$ or about 115° C. per one millisecond.

By this method the calculated threshold $\Delta T$ is about 115° C.

A second method of arriving at $\Delta T$ is by way of the data derived from Example 5. Example 5 demonstrates that the temperature at the record system surface when using a conventional fax such as a Canon Fax 230 is greater than 170° C. This is the temperature that the surface of the paper or media sees. The temperature of the thermal print head is higher, but the temperature observed at the surface of the media is alone relevant as regards the thermal stresses to which the capsules on the surface of the paper are subjected.

Room temperature is approximately 25° C. and thus should be subtracted from the temperature measured, 170° C. − 25° C. = 145°C. Based on the quantity of dye present, $\Delta T$ to effect fracture was calculated as approximately at least 115° C. per one millisecond but preferably 145° C. per one millisecond.

Since the capsules are nonmeltable or thermoset in character, there is no latent heat capacity and substantially no phase change.

In the examples, the record system when subjected to a thermal print head, resulted in ruptured capsules observed with a scanning electron microscope.

Photosensitive compositions are taught in U.S. Pat. Nos. 4,399,209; 4,440,846; 4,873,219 incorporated herein by reference.

The microcapsules contain a composition typically comprising a photoinitiator and an acrylate monomer. The microcapsule contents are photohardenable compositions which increase in viscosity. A typical example of a photohardenable composition useful in the present invention is ethylenically unsaturated compounds. These compounds contain at least one terminal ethylene group per molecule. Liquid ethylenically unsaturated compounds having two or more terminal ethylene groups per molecule are generally preferred. Examples of this preferred subgroup are ethylenically unsaturated acid esters of polyhydric alcohols or acrylate monomers such as ethyleneglycol dimethacrylate, triethylene glycol dimethacrylate, trimethylolpropane triacrylate (TMPTA), trimethylol propane trimethacrylate; pentaerythritol triacrylate, pentaerythritol trimethacrylate, etc.

Photoinitiators which form free-radicals by homolytic bond cleavage after photoexcitation or photoinitiators which generate a free-radical by abstraction of a hydrogen atom from a suitable hydrogen donor upon photoexcitation can be used. If a system which relies upon ionic polymerization is used, the photoinitiator may be the anion or cation generating type, depending on the nature of the polymerization.

Examples of photoinitiators useful in the present invention include diaryl ketone derivatives and benzoin alkyl ethers. The photoinitiator is based on the sensitivity of the system that is desired. Where ultraviolet sensitivity is desired, suitable photoinitiators include alkoxy phenyl ketones, o-acylated oximinoketones, polycyclic quinones, benzophenones, substituted benzophenones, xanthones, thioxanthones, halogenated compounds such as chlorosulfonyl and chloromethyl poly-nuclear aromatic compounds, chlorosulfonyl and chloromethyl heterocyclic compounds, chlorosulfonyl and chloromethyl benzophenones and fluorenones, and haloalkanes. In many cases, it is advantageous to use a combination of photoinitiators. For ultraviolet sensitivity one desirable combination is 2,2'-dimethoxy-2-phenylacetophenone, isopropylxanthone and ethyl para-dimethylaminobenzoate.

The amount of photoinitiator used in the photosensitive composition will depend on the particular photosensitive material selected. The photoinitiator may be used to sequester oxygen which is present in the microcapsules and inhibits photopolymerization.

The image-forming agent is a colorless electron donating compound or chromogen which forms color by reacting with a developer material. Representative examples of such compounds include substantially colorless compounds having a lactone, a lactam, a sulfone, a spiropyran, an ester or an amido structure in their partial skeleton such as triarylmethane compounds, bis-phenylmethane compounds, xanthene compounds, fluorans, thiazine compounds, spiropyran compounds and the like.

Eligible electron donating dye precursors which are chromogenic compounds, such as the phthalide, leucauramine and fluoran compounds, for use in the color-forming system are well known. Examples of the chromogens include Crystal Violet Lactone (3,3-bis(4-dimethylaminophenyl)-6-dimethylaminophthalide, U.S. Pat. No. Re. 23,024); phenyl-, indol-, pyrrol- and carbazol-substituted phthalides (for example, in U.S. Pat. Nos. 3,491,111; 3,491,112; 3,491,116; 3,509,174); nitro-, amino-, amido-, sulfon amido-, aminobenzylidene-, halo-, anilino-substituted fluorans (for example, in U.S. Pat. Nos. 3,624,107, 3,627,787, 3,641,011; 3,642,828; 3,681,390); spiro- dipyrans (U.S. Pat. No. 3,971,808); and pyridine and pyrazine compounds (for example, in U.S. Pat. Nos. 3,775,424 and 3,853,869). Other specifically eligible chromogenic compounds, not limiting the invention in any way, are: 3-diethylamino-6-methyl-7-anilino-fluoran (U.S. Pat. No. 3,681,390); 2-anilino-3-methyl-6-dibutylamino-fluoran (U.S. Pat. No. 4,510,513) also known as 3-dibutylamino-6-methyl-7-anilino-fluoran; 3-dibutylamino-7-(2-chloroanilino)fluoran; 3-(N-ethyl-N-tetrahydrofurfurylamino)-6-methyl-7-3-5'6-tris(di-methylamino)spiro[9H-fluorene-9'1(3'H)-isobenzofuran]-3'-one; 7-( 1-ethyl-2-methylindol-3-yl)-7-(4-diethylamino-2-ethoxyphenyl)-5,7-dihydrofuro[3,4-b]pyridin-5-one(U.S. Pat. No. 4,246,318); 3-diethylamino-7-(2-chloroanilino)fluoran (U.S. Pat. No. 3,920,510); 3-(N-methylcyclohexylamino)-6-methyl-7-anilino-fluoran (U.S. Pat. No. 3,959,571); 7-( 1-octyl-2-methylindol-3-yl)-7-(4-diethylamino-2-ethoxyphenyl)-5,7-dihydrofuro[3,4-b]pyridin-5-one; 3-diethylamino-7, 8-benzofluoran; 3,3-bis(1-ethyl-2-methylindol-3-yl) phthalide; 3-diethylamino-7-anilino-fluoran; 3-diethylamino-7-benzylamino-fluoran; 3'-phenyl-7-dibenzylamino-2,2'-spiro-di-[2H-1-benzo-pyran] and mixtures of any of the following.

Solvents such as the following can optionally be included in the microcapsules:

1. Dialkyl phthalates in which the alkyl groups thereof have from 4 to 13 carbon atoms, e.g., dibutyl phthalate, dioctylphthalate, dinonyl phthalate and ditridecyl phthalate
2. 2,2,4-trimethyl-1,3-pentanediol diisobutyrate (U.S. Pat. No. 4,027,065)
3. ethyldiphenylmethane (U.S. Pat. No. 3,996,405)
4. alkyl biphenyls such as monoisopropylbiphenyl (U.S. Pat. No. 3,627,581)
5. $C_{10}$–$C_{14}$ alkyl benzenes such as dodecyl benzene
6. diaryl ethers, di(aralkyl)ethers and aryl aralkyl ethers, ethers such as diphenyl ether, dibenzyl ether and phenyl benzyl ether
7. liquid higher dialkyl ethers (having at least 8 carbon atoms)
8. liquid higher alkyl ketones (having at least 9 carbon atoms)
9. alkyl or aralkyl benzoates, e.g., benzyl benzoate
10. alkylated naphthalenes
11. partially hydrogenated terphenyls When polymerizable acrylate monomers are employed in the photosensitive composition, use of solvent can be omitted entirely. In the preferred capsules, triacrylate monomer was employed without solvent. Specifically, trimethylpropane triacrylate monomer was preferred used alone without solvent.

The solvent, if included, is selected to facilitate dissolving the dye mixture while facilitating and not interfering with the photohardening process upon exposure to actinic radiation.

Examples of eligible acidic developer material include: clays, treated clays (U.S. Pat. Nos. 3,622,364 and 3,753,761); aromatic carboxylic acids such as salicylic acid; derivatives of aromatic carboxylic acids and metal salts thereof (U.S. Pat. No, 4,022,936); phenolic developers (U.S. Pat. Nos. 3,244,550 and 4,573,063); acidic polymeric material such as phenol-formaldehyde polymers, etc. (U.S. Pat. Nos. 3,455,721 and 3,672,935); and metal-modified phenolic resins (U.S. Pat. Nos. 3,732,120; 3,737,410; 4,165,102; 4,165,103; 4,166,644 and 4,188,456). Image enhancement by inclusion of metallic salts of carboxylic acids, such as use of zinc salicylate, can be optionally employed.

Processes of microencapsulation are now well known in the art. U.S. Pat. No. 2,730,456 describes a method for capsule formation. Other methods for microcapsule manufacture are U.S. Pat. Nos. 4,001,140; 4,081,376 and 4,089,802 describing a reaction between urea and formaldehyde; U.S. Pat. No. 4,100,103 describing reaction between melamine and formaldehyde; British Patent No. 2,062,750 describing a process for producing microcapsules having walls produced by polymerization of melamine and formaldehyde in the presence of a styrenesulfonic acid. The more preferred processes, in this invention, for forming microcapsules are from urea-formaldehyde resin and/or melamine formaldehyde resins as disclosed in U.S. Pat. Nos. 4,001,140; 4,089,802; 4,100,103; 4,105,823; or 4,552,811. The process of U.S. Pat. No. 4,552,811 is preferred. These patents are incorporated herein by specific reference. Additional preparations are described in the examples herein.

The capsules of U.S. Pat. No. 4,552,811 typically find use in carbonless systems but heretofore were not thought useful in thermally-sensitive record materials. While use of microcapsules in thermal systems is known, the art has taught away from the invention by teaching necessity for use of meltable microcapsules.

Significantly, albeit the precise mechanism is perhaps not fully understood, the microcapsules of the invention are believed ruptured by induced or produced thermal stresses rather than melting, to facilitate the reactive contact with the acidic developer material.

In addition to the capsules with chromogen and the developer, other materials such as sensitizers, fillers, antioxidants, lubricants, waxes, binders and brighteners optionally may be added if desired. Use of a sensitizer however is not required, and in the preferred mode was not used.

The record material of the invention has remarkable properties of being capable of forming a substantially non-reversible high density image upon selective thermal contact and of being deactivated from further imaging when the imaged record material is exposed to actinic radiation.

The record material includes a substrate or support material which is generally in sheet form. For purposes of this invention, sheets can be referred to as support members and are understood to also mean webs, rolls, ribbons, tapes, belts, films, cards and the like. Sheets denote articles having two large surface dimensions and a comparatively small thickness dimension. The substrate or support material can be opaque, transparent or translucent and could, itself, be colored or not. The material can be fibrous including, for example, paper and filamentous synthetic materials. It can be a film including, for example, cellophane and synthetic polymeric sheets cast, extruded or otherwise formed. The invention resides in the color-forming composition coated on the substrate. The kind or type of substrate material is not critical.

The components of the color-forming system are in substantially contiguous relationship, substantially homogeneously distributed throughout the coated layer material deposited on the substrate. The term substantially contiguous is understood to mean that the color-forming components are positioned in sufficient proximity such that upon selective heat exposure, a reactive color forming contact between the acidic developer and color-former is achieved. As is readily apparent to the person of ordinary skill in this art, these reactive components accordingly can be in the same coated layer or layers, or isolated or positioned in separate layers. In other words, one component can be positioned in the first layer, and reactive components positioned in a subsequent layer or layers, whether overcoat or subbing layers. All such arrangements are understood herein as being substantially contiguous.

The examples which follow are given to illustrate the invention and should not be considered as limiting. In the examples all parts or proportions are by weight and all measurements are in the metric system, unless otherwise stated.

The principles, preferred embodiments, and modes of operation of the present invention have been described in the foregoing specification. The invention which is intended to be protected herein, however, is not to be construed as limited to the particular forms disclosed, since these are to be regarded as illustrative rather that restrictive. Variations and changes can be made by those skilled in the art without departing from the spirit and scope of the invention.

EXAMPLE 1

Microcapsule Preparation

Internal Phase (IP)

| | | |
|---|---|---|
| 20 g | N102 3-diethylamino-6-methyl-7-anilino-fluor | |
| 180 g | Trimethylolpropane triacrylate (TMPTA) monomer | |
| 2 g | 2-Isopropyl Thioxanthone | Photo Initiator |
| 2 g | Ethyl-4-Dimethylamino benzoate | Photo Initiator |
| 24 g | 2,2-Dimethoxy-2-phenyl acetophenone | Photo Initiator |

Combine the first two components and dissolve with heat, then dissolve the photo initiators.

External Phase (EP)

| | | |
|---|---|---|
| 25 g | Colloid 351 (~25% solids) | Acrylic polymer, Rhone-Poulenc (acrylate butyl acrylate copolymer) |
| 198 g | Water | |

Adjust pH to 5.0 using 20% NaOH.

Emulsification

Place 170 g of EP in blender and with mild agitation add the IP solution. Increase the blender speed to achieve desired drop size (e.g., 50% of volume approximately 4.0μ) measured by Microtrac particle size analyzer from Leeds and Northrup Instruments, North Wales, Pa. 19454.

Encapsulation

Combine the following:

25 g Colloid 351 (~25% Solids)
42 g Water
    pH adjusted to 4.8 with 20% NaOH
30 g Cymel* 385 (~80% solids)

*Cymel is a trade mark of American Cyanamid Company. Cymel 385 is an etherified methylol melamine oligomer.

Add 70 g of the above to the emulsion and transfer to a vessel in a water bath. With stirring, heat the emulsion to 65° C. and allow to process several hours for encapsulation to occur.

Coating

Combine equal weight parts of:

1. Finished capsule dispersion
2. Durez 32421 phenolic resin dispersion (~50% solids) benzoic acid, 2-hydroxy-polymer, with formaldehyde, nonylphenol and ZnO.

This mixture is applied to paper or other desired substrate using, for example, a fixed gap applicator set a 0.001 inch. The resultant dried coating can be used to make a black copy in a thermal printer such as a commercial facsimile machine.

If desired, the resultant copy may be "fixed" or deactivated to thermal and/or pressure response by exposing to U.V. to polymerize the components. Approximately 5 second exposure to 15 Watt GE Bulbs (F15T8-BLB) is sufficient to "fix" the copy. After fixing, the sheet is resistant to scuff or abrasive induced markings.

Because of the reactive nature of the coating prior to fixing, the coating can suffer handling damage. This damage can be reduced by applying an overcoat that does not interfere with the thermal imaging nor with the subsequent fixing exposure. A typical overcoat would be the application of a 10% aqueous solution of Airvol* 540 using a #3 wire wound rod.

*Airvol is a trade mark of Air Products and Chemicals, Inc. and is a polyvinyl alcohol.

EXAMPLE 2

Microcapsule Preparation

External Phase (EP)

---
100 g  Water containing 5 g (dry) Colloid 351 adjusted to pH 4.0
5 g  Urea
0.5 g  Resorcinol
---

Emulsification and Encapsulation

Place EP in blender and add 114 g of IP as prepared in Example 1. Increase blender speed to achieve desired drop size. Transfer to beaker in water bath and, with stirring, add 14 g of 37% formaldehyde solution. Increase bath temperature to 55° C. and allow to process several hours for wall formation.

These capsules may be combined with phenolic resin dispersion as in Example 1 to prepare heat sensitive coatings that will provide images in facsimile machines.

EXAMPLE 3

Microcapsule Preparation

Internal Phase (IP)

---
20 g  Durez #27691 (p-phenyl phenol formaldehyde resin)
80 g  TMPTA monomer
Dissolve with heat, then dissolve
6 g  2,2-Dimethoxy-2-phenyl acetophenone photoinitiator
---

Emulsification

Using 80 g of EP from Example 1, emulsify the above internal phase to desired drop size of approximately 4μ (50% of volume) measured by Microtrac particle size analyzer from Leeds & Northrup Instruments, North Wales, Pa. 19454.

Encapsulation

Transfer the emulsion to a beaker in a water bath at ambient temperature. With stirring, add the following combined:

---
8 g  Colloid 351 (25% Solids)
14 g  Water
---

---
pH adjusted to 4.8 with 20% NaOH
10 g  Cymel 385 (80% Solids)
---

Increase the bath temperature to 65° C. and process several hours for encapsulation to occur.

Coating

The resultant capsules were combined with an equal quantity of capsules as prepared in Example 1, except the internal phase consisted of:

---
12 g  TECVL (3,3-bis(4-diethylaminophenyl)-6-dimethylaminophthalide)
188 g  TMPTA
4 g  2-Chlorothioxanthone          Photo Initiator
---

When this mixture was coated using a #12 when wound rod on suitable substrate and dried, a blue copy was obtained when imaged with a facsimile machine.

This record material like Example 1 can be similarly "fixed" under UV exposure.

EXAMPLE 4

In this example, the color former is supplied as discrete particles rather than in solution inside the capsules.

Using an attritor, sand mill or other appropriate grinding device, a 10% (wt.) dispersion of Pergascript Acid I-6B (Ciba Geigy), a 3,3-bis-(indol-3-yl)-phthalide, was prepared in a 2% solution of Airvol 203. The mean particle size was reduced to approximately 2μ.

Three parts of the capsule dispersion containing the p-phenyl phenol formaldehyde resin were combined with one part of the I-6B dispersion and coated on an appropriate substrate. When the dried coating was passed through a facsimile machine, a red copy was obtained.

EXAMPLE 5

Ascertaining Media Surface Temperature Using Fax Machine

Coatings of color former dispersion were prepared on a thin translucent paper substrate. Segments of the coatings were taped to a sheet of bond paper and used as the copy sheet in a Canon Fax-230. Melting was readily evident as clear (amorphous) characters on a relatively opaque background. Using this technique, the temperature at the surface of the media or sample was determined to be at least above 170° C. with a Canon Fax-230.

| Color Former | Melting Temp. + | Melt in Fax |
|---|---|---|
| diButyl N102 | ~170° C. | Yes |
| PSD-150 | ~200° C. | No |
| Green 118 | ~230° C. | No |

+As determined using the grinds on Kofler Hot Bar

EXAMPLE 6

| Internal Phase (IP): | 668.0 g  sec-butylbiphenyl (U.S. Pat. No. 4,287,074) |
|---|---|
|  | 545.0 g  $C_{11}$–$C_{15}$ aliphatic hydrocarbon |
| Heat to dissolve | 55.0 g  3-diethylamino-6-methyl-7-(2',4'-dimethylanilino)-fluoran |

-continued

| | | |
|---|---|---|
| | 6.5 g | Crystal Violet Lactone |
| | 6.1 g | I-6B (3,3-bis-(indol-3yl-phthalide) (CIBA-GEIGY) |
| External Phase: | 125.0 g | Colloid 351 (25%) |
| | 990.0 g | water |
| | Adjust to pH 5.0 w/20% NaOH | |

Emulsification:
  Cool IP to ~70° C. and add to external phase at ambient temperature in blender. Using speed control, emulsify to 50% volume size of 4–4.5μ (Microtrac particle size analyzer).

| Encapsulation: | Split emulsion into five portions of ~475 g and add to each: |
|---|---|
| | 25.0 g   Colloid 351 (25%) |
| | 42.0 g   Water |
| | pH adjusted to 4.7 w/20% NaOH |
| | 30.0 g   Resimene AQ7550 (80%) methylated melamine formaldehyde resin (Monsanto) |
| | (3.5 g   Na₂SO₄ may optionally be added to control viscosity) |

Each portion was placed in bath at 35° C., the others heated to 45°, 55°, 65°, 75° C. and allowed to stir for ~16 hrs.

After stirring, the 35° C. batch had essentially gelled and was not processed further. The other batches were combined with coreactant:

| | |
|---|---|
| 15.0 g | Capsule batch |
| 10.0 g | 10% Airvol 103 |
| 10.0 g | Durez 32421 |

Coatings were prepared on bond paper using #12 wire wound rod, dried, then topcoated using 10% Airvol 540 with a #3 rod. Sheets coated with the chromogen-containing melamine formaldehyde (MF) capsules, and also coated with coreactant in contiguous relationship were subjected to a hot plate test. The sample was placed on a 150° C. constant temperature metal block. A surface thermometer was used to monitor temperature. Melamine formaldehyde capsules processed overnight at a variety of temperatures were tested. Photo initiator and monomer were omitted in this example, as its purpose was to ascertain temperatures for formation of capsules according to the invention.

HOT PLATE TEST

Material: Capsules with melamine formaldehyde type polymeric shell or wall
Temperature at which capsules were formed (temperature°); 45° C.; 55° C.; 65° C. and 75° C. (overnight)
Temperature of hot plate=Constant=150° C.
Measure: Color density increase in % of ultimate density obtained with heat (density measured on MacBeth densitometer. Ultimate density (Dult) was measured as 1.34).

| Wall Forming Temperature | Room Temperature Color Density | Density at 1 minute at 150° C. | Time to Produce Dult x 10% |
|---|---|---|---|
| 45 | .67 | .92 | Initial Color Exceeds 10% |
| 55 | .04–.05 | .155 | 1–2 min. |
| 65 | .03 | .09 | 5–7 min. |
| 75 | .03 | .08 | 35 min. |

MacBeth density of 1.34 is taken as 100%, (maximum density).

EXAMPLE 7

| | | |
|---|---|---|
| Internal Phase (IP): | 900.0 g | TMPTA |
| | 100.0 g | 3-diethylamino-6-methyl-7-(-2',4'-dimethylanilino)-fluoran |
| Heat to dissolve | 70.0 g | (2,2-dimethoxy-2-phenylacetophenone) |
| Aqueous Phase: | 500.0 g | 10% aqueous solution of poly(ethylene-co-maleic anhydride) molecular weight. 75,000–90,000 (EMA) |
| | 1000.0 g | Water |
| | 50.0 g | Urea |
| | 5.0 g | Resorcinol |
| Adjust pH mixture to 3.5 with 20% NaOH | | |

Emulsification:
  Cool IP to ~70° C. and add to aqueous phase at ambient temperature in a blender. Using speed control, emulsify to size of 3–3.5μ for 50% of volume (size determined using microtrac)

Encapsulation:
  When desired size obtained, divide emulsion into eight 300 g portions and place in 55° C. bath with stirring.
  Immediately add 37% formaldehyde solution (F) to obtain range of F/(U+R) ratios:

| No. | Moles U + R | Desired Ratio F/(U + R) | Moles F | g. 37% F added |
|---|---|---|---|---|
| 1 | 0.10 | 1.3/1 | 0.13 | 10.5 |
| 2 | 0.10 | 1.5/1 | 0.15 | 12.2 |
| 3 | 0.10 | 1.7/1 | 0.17 | 13.8 |
| 4 | 0.10 | 1.9/1 | 0.19 | 15.4 |
| 5 | 0.10 | 2.1/1 | 0.21 | 17.0 |
| 6 | 0.10 | 2.6/1 | 0.26 | 21.1 |
| 7 | 0.10 | 3.3/1 | 0.33 | 26.7 |
| 8 | 0.10 | 4.0/1 | 0.40 | 32.4 |

R=Resorcinol is optionally but preferably included as a portion. After stirring for ~17 hours at 55°, Batch No. 1 showed no indication of capsules. The remaining batches were combined with an acidic coreactant using following ratios:

| | |
|---|---|
| 15 g | Capsule Batch |
| 10 g | 10% Airvol 103 |
| 10 g | Durez 32421 |

Coatings were prepared on bond paper using a 1 mil (approx. 22½ microns) wet gap type applicator. Coatings were dried, then top coated using a #3 wire wound rod and a 10% solution of Airvol 540.

| F/(U + R) | Room Temperature Color Density | Density at 1 minute at 150° C. | Time to Produce Dult x 10% |
|---|---|---|---|
| 1.7 | .06 | .25 | 40 sec |
| 1.9 | .04 | .17 | 67 sec |
| 2.0 | .02 | .14 | 9 min. |
| 2.1 | .03 | .16 | 146 sec |
| 2.6 | .04 | .25 | 40 sec |
| 3.3 | .04 | .30 | 18 sec |
| 4.0 | .04 | .42 | 10 sec |

MacBeth density of 1.57 is taken as 100% (maximum density).

What we claim is:

1. A record material comprising:

a substrate bearing nonmeltable microcapsules, said microcapsules prepared by a process in an aqueous manufacturing vehicle which comprises enwrapping intended capsule core material, substantially insoluble in said vehicle with polymeric walls produced by in situ polymerization of resins selected from melamine and formaldehyde, methylol melamine, or methylated methylol melamine, wherein the polymerization is conducted at a temperature of at least 65° C., said microcapsules containing a core material comprising chromogen and a photosensitive composition, said photosensitive composition undergoing a change in viscosity upon exposure to actinic radiation, an acidic developer material outside of said microcapsules capable of reacting with said chromogen to produce a color, said polymeric walls of said microcapsules having an elongation of not more than 1%, said record material being resistant to heat as measured by a background color development of less than 10% when the record material is placed in a 150° C. oven for 1 minute, said record material however forming a color upon application thereto of a point source energy input comprising a ΔT of at least 115° C. per one millisecond.

2. The record material according to claim 1 wherein ΔT is at least 145° C. per one millisecond.

3. The record material according to claim 1 wherein the resin is methylated methylol melamine.

4. The record material according to claim 1 wherein the resin is polymerization is conducted at about 75° C.

5. The record material according to claim 1 wherein the photosensitive composition comprises an acrylate monomer together with a photoinitiator selected from the group consisting of 2,2-dimethoxy-2-phenylacetophenone, isopropylxanthone, and ethyl-para-dimethylaminobenzoate.

6. A record material comprising:

a substrate bearing nonmeltable microcapsules, said microcapsules prepared by a process in an aqueous manufacturing vehicle which comprises enwrapping intended capsule core material, substantially insoluble in said vehicle with polymeric walls produced by in situ polymerization of resins selected from melamine and formaldehyde, methylol melamine, or methylated methylol melamine, wherein the polymerization is conducted at a temperature of at least 65° C., said microcapsules containing a core material comprising an acidic developer material and a photosensitive composition, said photosensitive composition undergoing a change in viscosity upon exposure to actinic radiation, a chromogen outside of said microcapsules capable of reacting with said acidic developer material to produce a color, said polymeric walls of said microcapsules having an elongation of not more than 1%, said record material being resistant to heat as measured by a background color development of less than 10% when the record material is placed in a 150° C. oven for 1 minute, said record material however forming a color upon application thereto of a point source energy input comprising a ΔT of at least 115° C. per one millisecond.

7. The record material according to claim 6 wherein ΔT is at least 145° C. per one millisecond.

8. The record material according to claim 6 wherein the resin is methylated methylol melamine.

9. The record material according to claim 6 wherein the resin is polymerization is conducted at about 75° C.

10. The record material according to claim 6 wherein the photosensitive composition comprises an acrylate monomer together with a photoinitiator selected from the group consisting of 2,2-dimethoxy-2-phenylacetophenone, isopropylxanthone, and ethyl-para-dimethylaminobenzoate.

* * * * *